United States Patent [19]

Okada et al.

[11] Patent Number: 5,325,240
[45] Date of Patent: Jun. 28, 1994

[54] DATA COMPRESSION AND EXPANSION APPARATUS FOR AUDIO RECORDERS

[75] Inventors: Tsuyoshi Okada, Takarazuka; Naoki Ejima, Hirakata, both of Japan

[73] Assignee: Matsushita Electric Industrial Co., Ltd., Osaka, Japan

[21] Appl. No.: 711,013

[22] Filed: Jun. 6, 1991

[30] Foreign Application Priority Data

Jun. 27, 1990 [JP] Japan .................................. 2-169031
Nov. 30, 1990 [JP] Japan .................................. 2-340454
Nov. 30, 1990 [JP] Japan .................................. 2-340456

[51] Int. Cl.$^5$ ............................................. G11B 20/10
[52] U.S. Cl. ........................................ 360/39; 360/48
[58] Field of Search ........................ 360/32, 39, 40, 48

[56] References Cited

U.S. PATENT DOCUMENTS 5,021,893 6/1991 Scheffler ........................... 360/15

FOREIGN PATENT DOCUMENTS 63-109613 5/1988 Japan .
1314022 12/1989 Japan .
1314023 12/1989 Japan .

*Primary Examiner*—David Mis
*Attorney, Agent, or Firm*—Stevens, Davis, Miller & Mosher

[57] ABSTRACT

A digital audio tape recorder apparatus (DAT) for compressing and expanding digital data during LP (long play) mode recording and reproducing, and for encoding level data at a sufficient resolution, especially in the range of 0 decibels where higher resolution is required. The data is compressed into a shorter data length compared to the absolute value of the digital audio data. The apparatus includes a first shift register which receives incoming parallel data and transforms the parallel data into serial data with the MSB (most significant bit) of the loaded parallel data being retained at the register while the parallel data is shifted in a LSB (least significant bit) direction. The load signal of the first shift register is generated by a load signal generator unit which includes a first binary counter and which generates the load signal by comparing the output of the first binary counter with the input parallel data to be loaded. The output of the first shift register, which has been signal processed, is input to a second shift register which transforms the serial data into parallel data. While the serial data is shifted through the second shift register, a second load signal generator unit generates load signals to retain the output of the second shift register and the second binary counter in accordance with the output of the second shift register.

4 Claims, 11 Drawing Sheets

FIG. 1

| 16 BIT PCM DATA | | 12 BIT COMPRESSED DATA |
|---|---|---|
| BIT: 15 14 13 12 11 10 9 8 7 6 5 4 3 2 1 0 | | 11 10 9 8 7 6 5 4 3 2 1 0 |
| 0 1 A B C D E F G H * * * * * * | ↔ | 0 1 1 1 A B C D E F G H |
| 0 0 1 A B C D E F G H * * * * * | ↔ | 0 1 1 0 A B C D E F G H |
| 0 0 0 1 A B C D E F G H * * * * | ↔ | 0 1 0 1 A B C D E F G H |
| 0 0 0 0 1 A B C D E F G H * * * | ↔ | 0 1 0 0 A B C D E F G H |
| 0 0 0 0 0 1 A B C D E F G H * * | ↔ | 0 0 1 1 A B C D E F G H |
| 0 0 0 0 0 0 1 A B C D E F G H * | ↔ | 0 0 1 0 A B C D E F G H |
| 0 0 0 0 0 0 0 1 A B C D E F G H | ↔ | 0 0 0 1 A B C D E F G H |
| 0 0 0 0 0 0 0 0 A B C D E F G H | ↔ | 0 0 0 0 A B C D E F G H |
| 1 1 1 1 1 1 1 1 A B C D E F G H | ↔ | 1 1 1 1 A B C D E F G H |
| 1 1 1 1 1 1 1 0 A B C D E F G H | ↔ | 1 1 1 0 A B C D E F G H |
| 1 1 1 1 1 1 0 A B C D E F G H * | ↔ | 1 1 0 1 A B C D E F G H |
| 1 1 1 1 1 0 A B C D E F G H * * | ↔ | 1 1 0 0 A B C D E F G H |
| 1 1 1 1 0 A B C D E F G H * * * | ↔ | 1 0 1 1 A B C D E F G H |
| 1 1 1 0 A B C D E F G H * * * * | ↔ | 1 0 1 0 A B C D E F G H |
| 1 1 0 A B C D E F G H * * * * * | ↔ | 1 0 0 1 A B C D E F G H |
| 1 0 A B C D E F G H * * * * * * | ↔ | 1 0 0 0 A B C D E F G H |

WHERE "ABCDEFGH" IS AN ARBITRARY DATA BETWEEN "00000000" TO "11111111", AND EACH "*" IS EITHER 0 OR 1

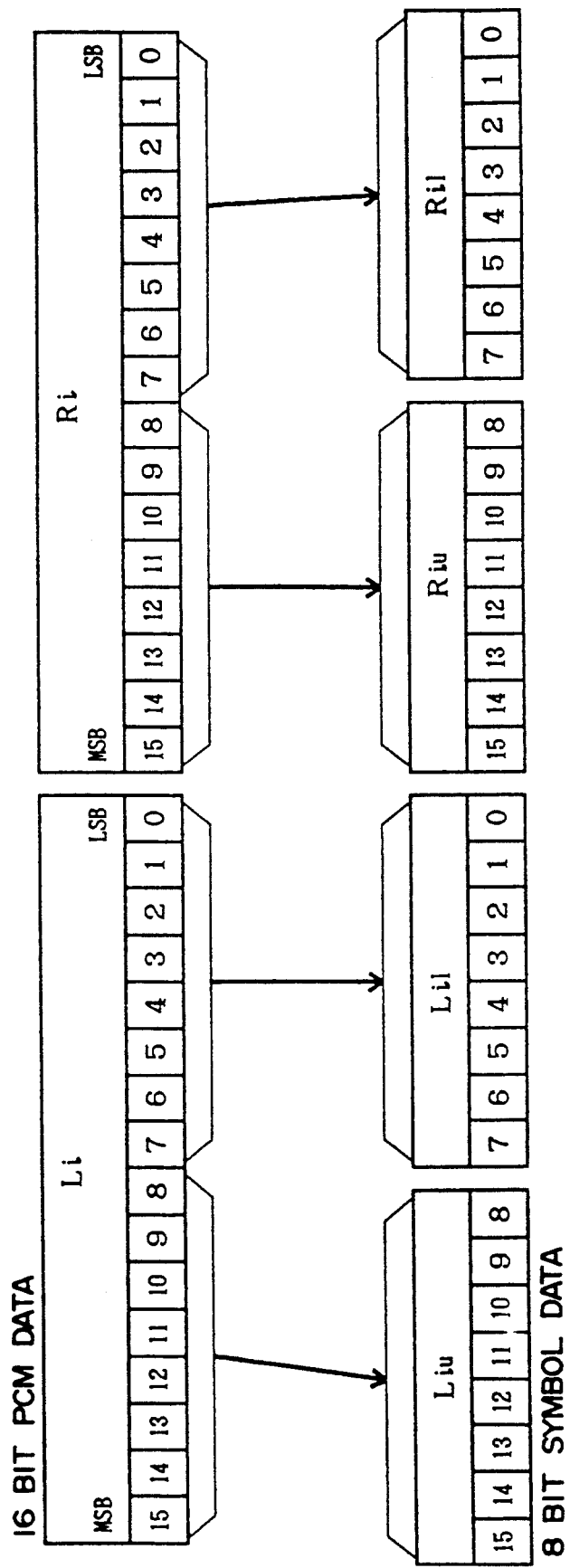
F I G. 3

FIG. 10

| ABSOLUTE VALUE OF 16-BIT PCM DATA | | | | | | | | | | | | | | | | 8-BIT COMPRESSED LEVEL DATA | | | | | | | | LEVEL RANGE (dB) | RESOLUTION (dB) |
|---|---|---|---|---|---|---|---|---|---|---|---|---|---|---|---|---|---|---|---|---|---|---|---|---|---|
| BIT: 14 | 13 | 12 | 11 | 10 | 9 | 8 | 7 | 6 | 5 | 4 | 3 | 2 | 1 | 0 | | 7 | 6 | 5 | 4 | 3 | 2 | 1 | 0 | | |
| 1 | 1 | A | B | C | D | * | * | * | * | * | * | * | * | * | → | 1 | 1 | 1 | 1 | A | B | C | D | 0 ~ −1.16 | 0.073 |
| 1 | 0 | A | B | C | D | * | * | * | * | * | * | * | * | * | → | 1 | 1 | 1 | 0 | A | B | C | D | −1.16 ~ −2.50 | 0.084 |
| 1 | 0 | A | B | C | D | * | * | * | * | * | * | * | * | * | → | 1 | 1 | 0 | 1 | A | B | C | D | −2.50 ~ −4.08 | 0.099 |
| 1 | 0 | 0 | A | B | C | D | * | * | * | * | * | * | * | * | → | 1 | 1 | 0 | 0 | A | B | C | D | −4.08 ~ −6.02 | 0.12 |
| 0 | 1 | 1 | A | B | C | D | * | * | * | * | * | * | * | * | → | 1 | 0 | 1 | 1 | A | B | C | D | −6.02 ~ −8.52 | 0.16 |
| 0 | 1 | 0 | A | B | C | D | * | * | * | * | * | * | * | * | → | 1 | 0 | 1 | 0 | A | B | C | D | −8.52 ~ −12.04 | 0.22 |
| 0 | 0 | 1 | A | B | C | D | * | * | * | * | * | * | * | * | → | 1 | 0 | 0 | 1 | A | B | C | D | −12.04 ~ −18.06 | 0.38 |
| 0 | 0 | 0 | 1 | A | B | C | D | * | * | * | * | * | * | * | → | 1 | 0 | 0 | 0 | A | B | C | D | −18.06 ~ −24.08 | 0.38 |
| 0 | 0 | 0 | 0 | 1 | A | B | C | D | * | * | * | * | * | * | → | 0 | 1 | 1 | 1 | A | B | C | D | −24.08 ~ −30.10 | 0.38 |
| 0 | 0 | 0 | 0 | 0 | 1 | A | B | C | D | * | * | * | * | * | → | 0 | 1 | 1 | 0 | A | B | C | D | −30.10 ~ −36.12 | 0.38 |
| 0 | 0 | 0 | 0 | 0 | 0 | 1 | A | B | C | D | * | * | * | * | → | 0 | 1 | 0 | 1 | A | B | C | D | −36.12 ~ −42.14 | 0.38 |
| 0 | 0 | 0 | 0 | 0 | 0 | 0 | 1 | A | B | C | D | * | * | * | → | 0 | 1 | 0 | 0 | A | B | C | D | −42.14 ~ −48.16 | 0.38 |
| 0 | 0 | 0 | 0 | 0 | 0 | 0 | 0 | 1 | A | B | C | D | * | * | → | 0 | 0 | 1 | 1 | A | B | C | D | −48.16 ~ −54.19 | 0.38 |
| 0 | 0 | 0 | 0 | 0 | 0 | 0 | 0 | 0 | 1 | A | B | C | D | * | → | 0 | 0 | 1 | 0 | A | B | C | D | −54.19 ~ −60.21 | 0.38 |
| 0 | 0 | 0 | 0 | 0 | 0 | 0 | 0 | 0 | 0 | 1 | A | B | C | D | → | 0 | 0 | 0 | 1 | A | B | C | D | −60.21 ~ −66.23 | 0.38 |
| 0 | 0 | 0 | 0 | 0 | 0 | 0 | 0 | 0 | 0 | 0 | A | B | C | D | → | 0 | 0 | 0 | 0 | A | B | C | D | −66.23 ~ | 0.38 |

FIG. 11

| ABSOLUTE VALUE OF 16-BIT PCM DATA | 8-BIT COMPRESSED LEVEL DATA | LEVEL RANGE (dB) | RESOLUTION (dB) |
|---|---|---|---|
| BIT: 14 13 12 11 10 9 8 7 6 5 4 3 2 1 0 | 7 6 5 4 3 2 1 0 | | |
| 1 A B C D * * * * * * * * * * → | 1 0 1 1 A B C D : | 0 ~ −6.02 | 0.38 |
| 0 1 A B C D * * * * * * * * * → | 1 0 1 0 A B C D : | −6.02 ~ −12.04 | 0.38 |
| 0 0 1 A B C D * * * * * * * * → | 1 0 0 1 A B C D : | −12.04 ~ −18.06 | 0.38 |
| 0 0 0 1 A B C D * * * * * * * → | 1 0 0 0 A B C D : | −18.06 ~ −24.08 | 0.38 |
| 0 0 0 0 1 A B C D * * * * * * → | 0 1 1 1 A B C D : | −24.08 ~ −30.10 | 0.38 |
| 0 0 0 0 0 1 A B C D * * * * * → | 0 1 1 0 A B C D : | −30.10 ~ −36.12 | 0.38 |
| 0 0 0 0 0 0 1 A B C D * * * * → | 0 1 0 1 A B C D : | −36.12 ~ −42.14 | 0.38 |
| 0 0 0 0 0 0 0 1 A B C D * * * → | 0 1 0 0 A B C D : | −42.14 ~ −48.16 | 0.38 |
| 0 0 0 0 0 0 0 0 1 A B C D * * → | 0 0 1 1 A B C D : | −48.16 ~ −54.18 | 0.38 |
| 0 0 0 0 0 0 0 0 0 1 A B C D * → | 0 0 1 0 A B C D : | −54.18 ~ −60.20 | 0.38 |
| 0 0 0 0 0 0 0 0 0 0 1 A B C D → | 0 0 0 1 A B C D : | −60.20 ~ −66.22 | 0.38 |
| 0 0 0 0 0 0 0 0 0 0 0 A B C D → | 0 0 0 0 A B C D : | −66.22 ~ | |

WHERE "ABCD" IS AN ARBITRARY VALUE BETWEEN "0000" TO "1111", AND EACH "*" ARE EITHER "0" OR "1"

DATA COMPRESSION AND EXPANSION APPARATUS FOR AUDIO RECORDERS

BACKGROUND OF THE INVENTION

1. Field of the Invention

The present invention relates to a digital audio tape recorder apparatus, and is particularly concerned with data compression and expansion used in LP (long play) mode, and with encoding level data in recording and reproducing audio data.

2. Description of the Prior Art

Digital audio tape recorders (hereinbelow also referred to as DAT) using rotary heads have been available in the Japanese market since 1987. The DAT standard is defined in "Standard of Electronic Industries Association of Japan, ELAJ CP-2305, DAT Cassette System Part 1: Dimensions and Characteristics, Established in December 1989, Prepared by Technical Study Committee on DAT, Published by Electronic Industries Association of Japan (Address: 2-2, Marunouchi 3-chome, Chiyoda-ku, Tokyo 100, Japan), printed in Japan" and in International Electrotechnical Committee document "IEC 60A(S)122".

In recording and reproducing audio data, DAT systems have five recording modes. Three of the modes are for 2-channel normal tape speed modes (hereinbelow also referred to as normal mode) in accordance with different sampling frequencies (hereinbelow also referred to as Fs), Fs=48 k, 44.1 k, and 32 kHz. The remaining modes are for 2-channel LP mode and for 4-channel mode.

Recording in LP mode is achieved by rotating the cylindrical heads at half the normal speed and by compressing the incoming 16-bit PCM (pulse code modulation) data, with Fs=32 kHz, into 12-bit data. The compressed data is reexpanded to 16-bit data during the reproducing process. By using this method, 4 hours of audio data can be recorded on a DAT cassette tape which has a 2 hour recording capacity in normal mode.

Hereinbelow will be described a data compression and expansion method used for recording and reproducing audio data in LP mode. Referring to FIG. 1 of the accompanying drawings, this figure shows the data compression and expansion method used between 16-bit PCM data and 12-bit compressed data. The compression method for recording PCM data is as follows:

Sixteen-bit PCM data is compressed into 12-bit data in accordance with a length of bits that is identical to a most significant bit (hereinbelow also referred to as MSB) which is regarded as the sign bit. The 12-bit compressed data has the same MSB as that of the original 16-bit PCM data. The succeeding 3 bits represent how many continuous bits next to the MSB are identical to the MSB. This 3-bit sequence is in regular binary code for MSB="1", and is provided in 2's complement form for MSB="0". The 3-bit binary code represents a bit length up to seven. The remaining 8-bits are the same as those bits of the original 16-bit PCM data which occur after the first bit which is inverse to the MSB, provided that the 8 bits are identical with the lower 8 bits of the original 16-bit PCM data when the upper 8 bits of the 16-bit data and the 12-bit data are all identical to each other. For example, if the incoming 16-bit PCM data is "0000 0100 1101 0110" in MSB to LSB (least significant bit) order (which corresponds to the case on the dotted line in FIG. 1), then the bit length of the number of continuous bits next to the MSB which are identical to the MSB is four. Thus, the results of the 16-bit to 12-bit compression would be "0011 0011 0101" (where "ABCD EFGH" in FIG. 1 corresponds to "0011 0101").

After the incoming 16-bit PCM data is compressed into 12-bit data, each corresponding set of L channel and R channel data is converted into three sets of audio data symbol data. Each set of audio data symbol data consists of 8 bits, as shown in FIG. 2 (where Li and Ri represent the 12-bit compressed data of L channel and R channel at sample i). Liu and Riu are the 8-bit upper symbol data, respectively, and LRil is the 8-bit lower symbol data consisting of the remaining 4 bits of both of the channels. The three sets of symbol data are recorded on a magnetic tape, after the error correction codes have been added by the signal processor means.

Referring now to FIG. 3, this figure shows the data conversion method for converting 16-bit PCM data into 8-bit symbol data during normal mode operation. The incoming 16-bit PCM data is converted into two audio data symbols sets for each channel. Each sets consists of 8 bits (where Liu and Riu are the upper 8 bits of the L channel and R channel data at sample i and Lil and Ril are the lower 8 bits of the L channel and R channel data of sample i, respectively). The four symbol data sets are recorded on a magnetic tape after the error correction codes have been added by the signal processor means.

When reproducing a recorded tape, the DAT system identifies which mode the PCM data was recorded in from the sampling frequency information and quantization information that is recorded as subcode data accompanying the PCM data. If the PCM data was recorded in normal mode (i.e., where the sampling frequency is either Fs=48 k, 44.1k or 32 kHz and quantization is 16 bits uniform), then the reproduced 8-bit symbol data sets are reorganized as 16-bit PCM data, introducing the error correction method (a detailed description of which is omitted in this specification), and are transformed into an analog audio signal by a digital-to-analog converter. If the PCM data was recorded in LP mode (i.e., where the sampling frequency is 32 kHz and the quantization is 12 bits non-uniform), then the reproduced 8-bit symbol data sets are reorganized as 12-bit compressed data thus introducing the error correction method. The 12-bit compressed data is expanded into 16-bit PCM data in accordance with the expansion method shown in FIG. 1. When expanding the 12-bit compressed data into 16 bits, there are some cases where an additional bit should be appended to the lower bits. The mark "*", shown in FIG. 1, marks those bits to be appended. Although the DAT specification EIAJ CP-2305 published by Electronic Industries Association of Japan (EIAJ) does not specify what data should be provided to these bits, it is known that filling such areas with either "01111 . . . " or "10000 . . . " generally realizes lower noise generation caused by the expansion. The expanded 16-bit PCM data is transformed into an analog audio signal by a digital-to-analog converter.

In an attempt to deal with both normal mode recording and LP mode recording, a data compression arrangement in a prior art digital audio tape recorder has been proposed in Laid Open Japanese Patent Application No. HEI 1-314023. According to this patent application, the prior art data compression arrangement comprises a shift register to transform incoming serial data into parallel data; a shift control means which controls the shift clock of the shift register in accordance with the upper N bits of incoming serial data; a data transform means which generates L-bit data in accordance with the upper N bits of incoming serial data, which become the upper L bits of the compressed data; and a selector means for selecting specific output bits of the shift register and of the data transform means in accordance with the system operation mode, which is either normal mode or LP mode. When the system is operating in normal mode, the data compression arrangement outputs 16-bit parallel data to which incoming serial data is transformed, and when the system is operating in LP mode, the data compression arrangement derives 12-bit compressed data combining 4-bit (L=4) data outputted from the data transform means with 8 bits of specified output from the shift register.

A related patent application concerned with the data expansion arrangement in a prior art digital audio tape recorder has also been proposed in laid Open Japanese Patent Application HEI 1-314022. According to this patent application, the prior art data expansion arrangement comprises a selector means to which incoming parallel data and fixed data are provided and which selects specific bits of the incoming parallel data and the fixed data in accordance with the system operation mode; a shift register, to which parallel data selected by the selector means is provided, which transforms the parallel data into serial data by shifting in a LSB-first direction; and a shift control means which controls the shift clock of the shift register in accordance with the upper L bits of the input parallel data from the selector means. When the system is operated in normal mode, 16-bit parallel data is provided to the selector means, and the whole set of bits is input to the shift register means. The shift register means transforms input 16-bit parallel data into serial data. When the system is operated in LP mode, 12-bit parallel data is provided to the selector means. The selector means selects the lower 8 bits of the input 12-bit parallel data and the fixed data and provides them to the shift register means. Also, the upper 4 bits of the input 12-bit parallel data are provided to the shift control means. The shift register shifts the loaded parallel data in accordance with a shift clock controlled by shift control means, and hence expanded data is derived.

There is, however, a problem in the prior art. The prior art data compression and expansion arrangement requires extra shift registers to transform the serial data between LSB-first and MSB-first; or otherwise extra shift control means and extra time slots are required to shift the serial data backwards and forwards within the same shift register. This is because, although the data compression arrangement is operative when the system is operating in a recording mode and the data expansion arrangement is also operative when the system is operating in a reproduction mode, both arrangements (recording and reproducing) share signal processor means for providing processes such as interpolation and mute to the incoming data.

For example, the output of the data expansion arrangement is supplied to the signal processor means before the reproduced data is output, and the input of the data compression arrangement is supplied from signal processor means which have already processed the recording data. Therefore, as far as the data serially processed at the signal processor means, it is preferable that the output format of the data expansion arrangement is the same as the input format of the data compression arrangement. Also, since the shift register in the prior art data compression means is controlled by a shift control means, which controls the shift clock in accordance with the data to be compressed, it is difficult to utilize the shift register for other processes such as encoding level data. Therefore, the overall signal processor arrangement of the prior art digital audio tape recorder is large in circuit scale and the unit cost of the LSI signal processor, including the data compression and expansion arrangements, cannot be reduced sufficiently.

Hereinbelow will be described the level encoder arrangement of a prior art digital audio tape recorder. In recording and reproducing audio data with a DAT system, level data is important information in identifying whether the incoming data is properly recorded and for identifying how large the reproducing signals are. The most popular way to express digital data levels can be realized by deriving the absolute value of each sample data and detecting the peak absolute value over a certain period. The absolute value of digital data can be derived by executing an exclusive-or operation between the MSB and the remainder bits. The level data is generally presented in decibels (dB) and can be derived from the absolute value by applying the following equation:

$$\text{Level} = 20 \times \log \frac{\text{Detected Absolute Value}}{\text{Full-scale Absolute Value}} \text{ [dB]} \quad \text{(Eq. 1)}$$

For example, with 16-bit PCM data the absolute value of each sampled data will be within "000 0000 0000 0000"-"111 1111 1111 1111" in binary code, or "0000"-"7FFF" in hexadecimal. The resolution of level data using a 15-bit absolute value scheme is uniform and a precise level can be represented in every range.

However, there is a problem that a level encoder arrangement which generates absolute values of 16-bit PCM data requires 2 sets of 15-bit flip-flops for retaining absolute values of L channel and R channel PCM data and control circuits to compare and update such level data. Therefore, the level encoder arrangement is large in circuit scale, and thus the unit cost of the LSI signal processor, including the level encoder arrangement, cannot be reduced sufficiently. Moreover, since the 15-bit level data is transferred to the system controller means via an 8-bit data bus, a large portion of time of the total system control process is required for receiving the 4 bytes of level data and deriving a graphic or numerical display data from them. This operates to limit enhancements to the system function.

In an attempt to deal with these problems, a level encoder arrangement of a prior art digital tape recorder has been proposed in Laid Open Japanese Patent Application SHO 63-109613. This level encoder arrangement alleviates these problems by having the shift register for generating 12-bit compressed data in LP mode also generate compressed level data. This level encoder arrangement also shares the data regarding the bit length of successive bits which are identical to the MSB for both encoding the upper 4 bits of the 12-bit compressed data in LP mode and for encoding the compressed level data. According to this patent application, the level encoder arrangement comprises a shift register, to which N-bit data is provided, which outputs the upper L bits of the input data; a transform pattern detector means for deriving a shift number of the N-bit data provided to the shift register from the L-bit output of the shift register; a timing generator means which receives the shift number information and derives a shift clock for the shift register; and a decibel data generator means which derives the decibel value of the input N-bit data from the output of the shift register.

However, there is still a problem in that the level encoder arrangement of the prior art digital audio tape recorder requires a decibel value generator means which calculates the decibel value of incoming PCM data from the output of the shift register and the bit length data of successive bits identical to the MSB. Therefore, this level encoder arrangement of the prior art digital audio tape recorder is still large in circuit scale and thus the unit cost of the LSI signal processor, including the level data encoder arrangement, cannot be reduced sufficiently. Moreover, the resolution of level data which can be represented by the compressed data in the prior art level encoder is not sufficient to allow using it as a reference for adjusting recording levels and for monitoring reproduced 16-bit digital audio, especially in the range of zero dB, where higher resolution, as much as 0.1 dB, is required.

SUMMARY OF THE INVENTION

One object of the present invention is to provide a data compression and expansion circuit arrangement in which the above problems are alleviated.

Another object of the present invention is to provide a level encoder which encodes compact level data, suitable for transfer to the system controller means and for processing at the system controller means, which simultaneously has sufficient level resolution in every range and especially near zero dB, where higher resolution is required.

Another object of the present invention is to realize a serial procedure of data compression and expansion and level encoding in an identical data shifting process, which reduces total circuit arrangements and contributes to cost reduction of the signal processor including such circuits.

According to the present invention, an apparatus for compressing and expanding digital data, and for encoding level data is provided, comprising:
a first shift register for transforming the incoming parallel data into a serial data stream, shifting the parallel data in the LSB direction at a bit rate faster than the rate for shifting loaded parallel data in the loading cycle, hence, extending the period the MSB is present at the register by retaining it at the loaded register while shifting the loaded data;
a first binary counter means for counting so as to determine the timing when the output of the counter corresponds to incoming parallel data and generating the load control signal for the first shift register means;
a second shift register for transforming the incoming serial data into a parallel data stream;
a data retaining means for retaining the outputs of the second shift register and a second binary counter;
a second binary counter means for deriving a retain control signal for the data retaining means by counting the shift number until the output of the second shift register meets prescribed conditions; and
a selector means for selecting the data to be retained by the data retaining means in accordance with an output of the second binary counter.

The above, and other objects, features and advantages of this invention will be apparent to those skilled in the art from the following detailed description of illustrative embodiments which is to be read in connection with the accompanying drawings.

BRIEF DESCRIPTION OF THE DRAWINGS

FIG. 1 shows a data compression and expansion method between 16-bit PCM data and 12-bit compressed data in LP mode operation for recording and reproducing in a DAT system;

FIG. 3 shows a data conversion method between 16-bit PCM data and 8-bit symbol data in a DAT system operating in normal mode;

FIG. 10 shows the relationship between 15-bit absolute value sampled data and 8-bit compressed level data encoded by the level encoder arrangement embodiment shown in FIG. 9 and the level range and resolution which can be represented by the 8-bit compressed level data;

FIG. 11 shows an example of the relationship between 15-bit absolute value sampled data and 8-bit compressed level data encoded by a prior art level encoder arrangement which applied the data compression method in LP mode.

The same or corresponding elements or parts are designated by like reference numerals throughout the drawings.

DESCRIPTION OF THE PREFERRED EMBODIMENTS

To overcome the problems described above, embodiments of the present invention provide a data compression and expansion means which requires less additional circuits for those systems operating in normal recording and/or reproducing mode, by commonly using a shift register for transforming incoming parallel data into serial data for data expansion in LP mode reproducing and for maintaining the MSB of the incoming parallel data; and by commonly using the shift register for transforming serial data, to which signal processing has already been performed, into parallel data for data compression in LP mode recording and for encoding 8-bit compressed level data with sufficient resolution, especially near zero dB, where higher resolution is required.

Figure 4:
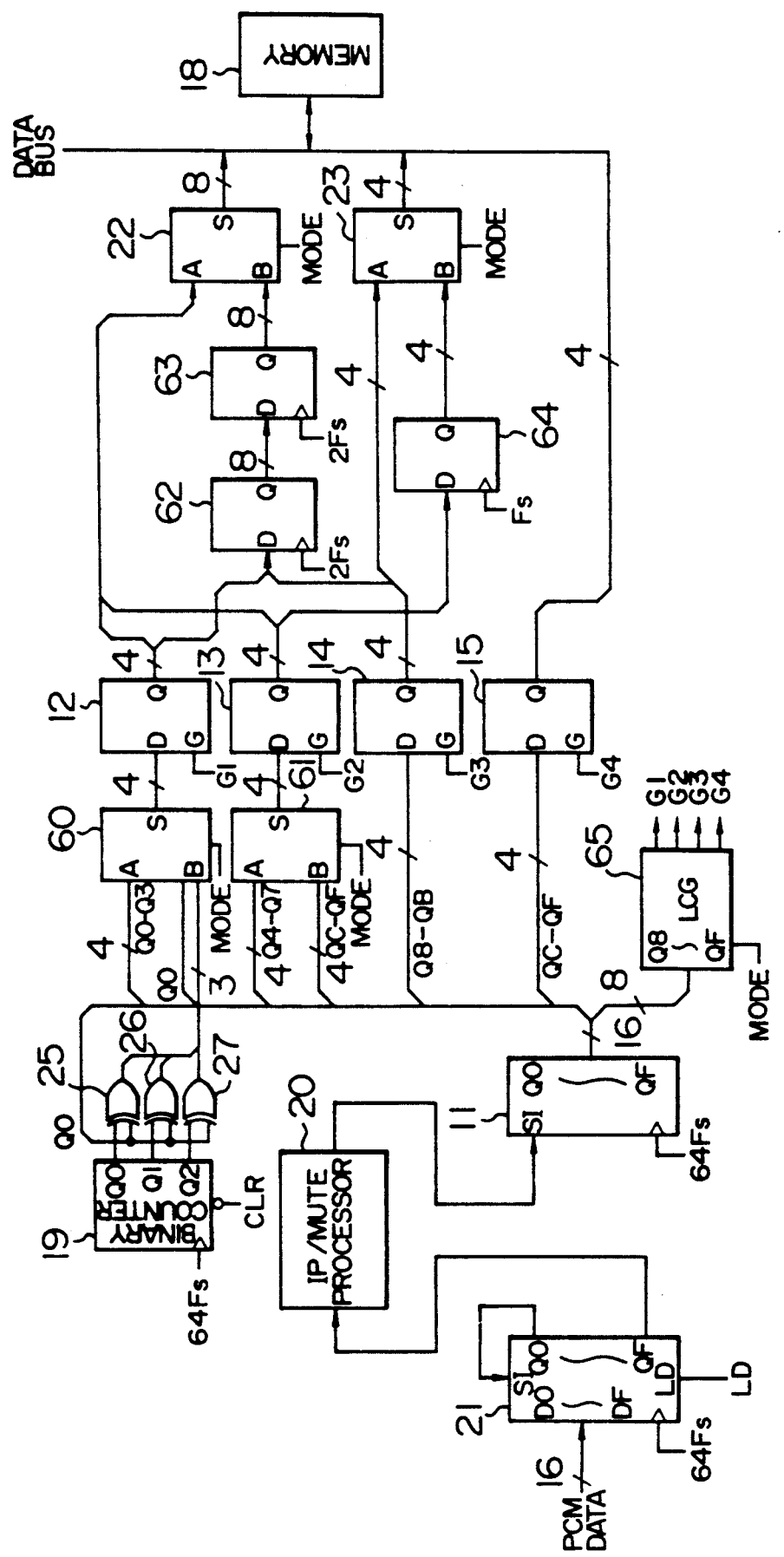
FIG. 4 shows a block diagram of an embodiment of the data compression arrangement according to the present invention.

Hereinbelow will be described an embodiment of a data compression arrangement of the digital audio tape recorder apparatus of the present invention. Referring to FIG. 4, the embodiment comprises a first shift register 21, a second shift register 11, selectors 60, 61, 22, 23, latches 12–15, flip-flops 62–64, a binary counter 19, EXCLUSIVE-OR gates 25-27, a control signal generator means (LCG) 65, and a memory 18.

As described above, the incoming 16-bit parallel PCM data is loaded into the first shift register 21 in accordance with control signal LD and is shifted out at output QF, in a LSB-first direction, by shift clock 64Fs (where Fs is the sampling frequency of the incoming PCM data). While shifting the loaded data at shift register 21, output QO, which corresponds to the MSB of the loaded data, is input into serial input SI so that the MSB is retained until the next set of parallel data is loaded. Therefore, the serial output consists of 16 bits of incoming PCM data with an additional 16 bits of extended MSB data. After interpolation and mute processes are performed at IP/Mute Processing means 20, the serial data is input to shift register 11 and transformed into parallel data.

When the system is operating in normal mode, the control signal MODE at selectors 60, 61, 22, 23 is "Low" so that input A of each selector is selected. Selector 60 selects the upper 4 bits of the output of shift register 11, which are outputs QO-Q3. Selector 61 selects the next bits of the output of shift register 11, which are outputs Q4-Q7. The selected data is retained at latches 12, 13 in accordance with control signals G1 and G2, respectively. Also the lower 8-bit output of shift register 11, which are outputs Q8-QB and QC-QF, are retained at latches 14, 15, in accordance with control signal G3 and G4, respectively. Control signals G1, G2, G3 and G4 are generated by control signal generator means (LCG) 65 in accordance with the incoming upper 8 bits of the output of shift register 11 and control signal MODE. All of the data retained at latches 12-15 are stored at memory 18, in turn, after being selected by selectors 22, 23.

When the system is operating in LP mode, the control signals MODE at selectors 60, 61, 22, 23 are "High" so that inputs B of each selector are selected. The binary counter 19 is cleared by reset signal CLR at the time when the first bit (LSB) of each sample of serial data is input to serial input SI of shift register 11 and reaches output QF. Binary counter 19 counts up as the input data shifts through shift register 11 by shift clock 64Fs. Selector 60 selects output QO of shift register 23 and the output of EXCLUSIVE-OR gates 25-27, which are the results of exclusive-or operations between output QO (MSB) of shift register 11 and outputs QO-Q2 of binary counter 19. Selector 61 selects outputs QC-QF of shift register 11.

Figure 2:
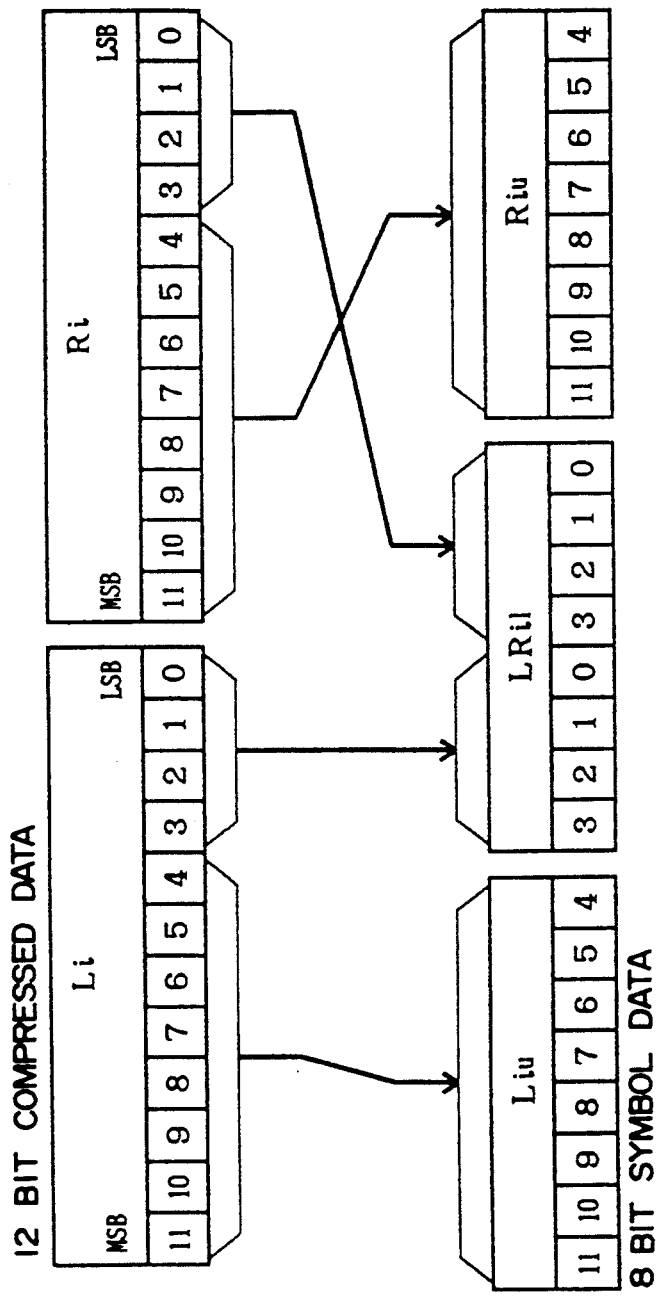
FIG. 2 shows a data conversion method between 12-bit compressed data and 8-bit symbol data in a DAT system operating in LP mode.
Figure 5:
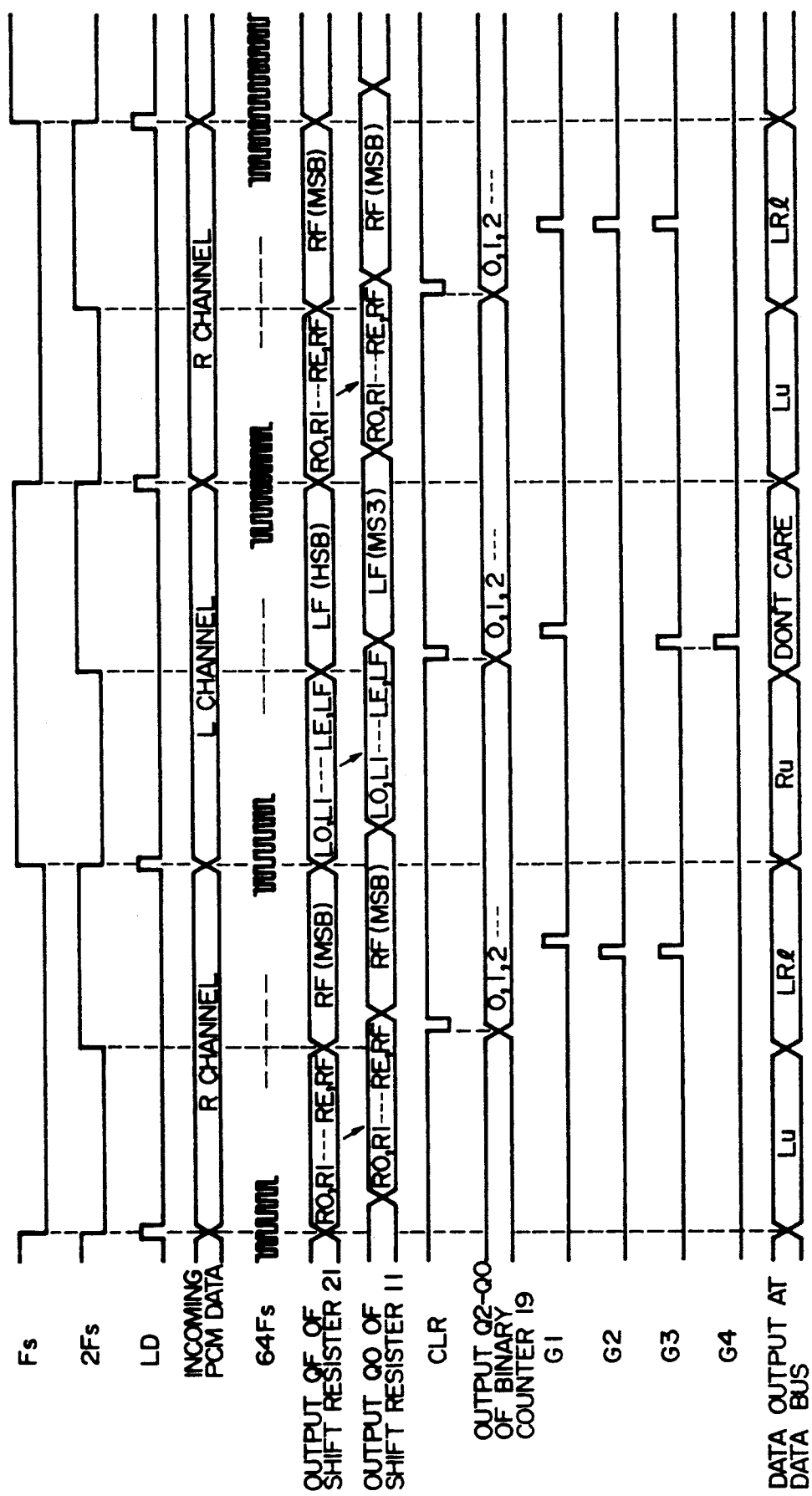
FIG. 5 shows in a brief timing chart the operation of the data compression arrangement according to the embodiment of the present invention shown in FIG. 4.

FIG. 5 shows a brief timing chart of control signals G1, G2, G3, G4 and the contents of data bus shown in FIG. 4, when the apparatus is operated in LP mode. Latch 12 in FIG. 4 retains the output of selector 60, which corresponds to the upper 4 bits (bits 11-8) of the 12-bit compressed data, shown in FIG. 2, in accordance with control signal G1, as shown in FIG. 5. Latch 14 retains outputs Q8-QB of shift register 11, which correspond to the next 4 bits (bits 7-4) of the 12-bit compressed data shown in FIG. 2, in accordance with control signal G3. Latch 13 retains outputs QC-QF of shift register 11, which correspond to the lower 4 bits (bits 3-0) of the L-channel 12-bit compressed data shown in FIG. 2, in accordance with control signal G2. Latch 15 retains outputs Q3-QO of shift register 11, which corresponds to the lower 4 bits (bits 3-0) of the R-channel 12-bit compressed data shown in FIG. 2, in accordance with control signal G4. The outputs of latches 13 and 15 are retained at flip-flop 62 as the upper 8 bits of 12-bit compressed data (Liu, Riu), as shown in FIG. 2, by control signal 2Fs, and are delayed for half the sample period by flip-flop 63. The output of latch 13 is delayed for 1 sample period at flip-flop 64, which is controlled by control signal Fs, and is outputted to the data bus as combined data of the lower 4 bits of the L and R channels (LRil), as shown in FIG. 2. Thus, the 12-bit compressed data of the L and R channels are stored at memory 18 in the order of Liu, LRil, Riu.

Figure 6:
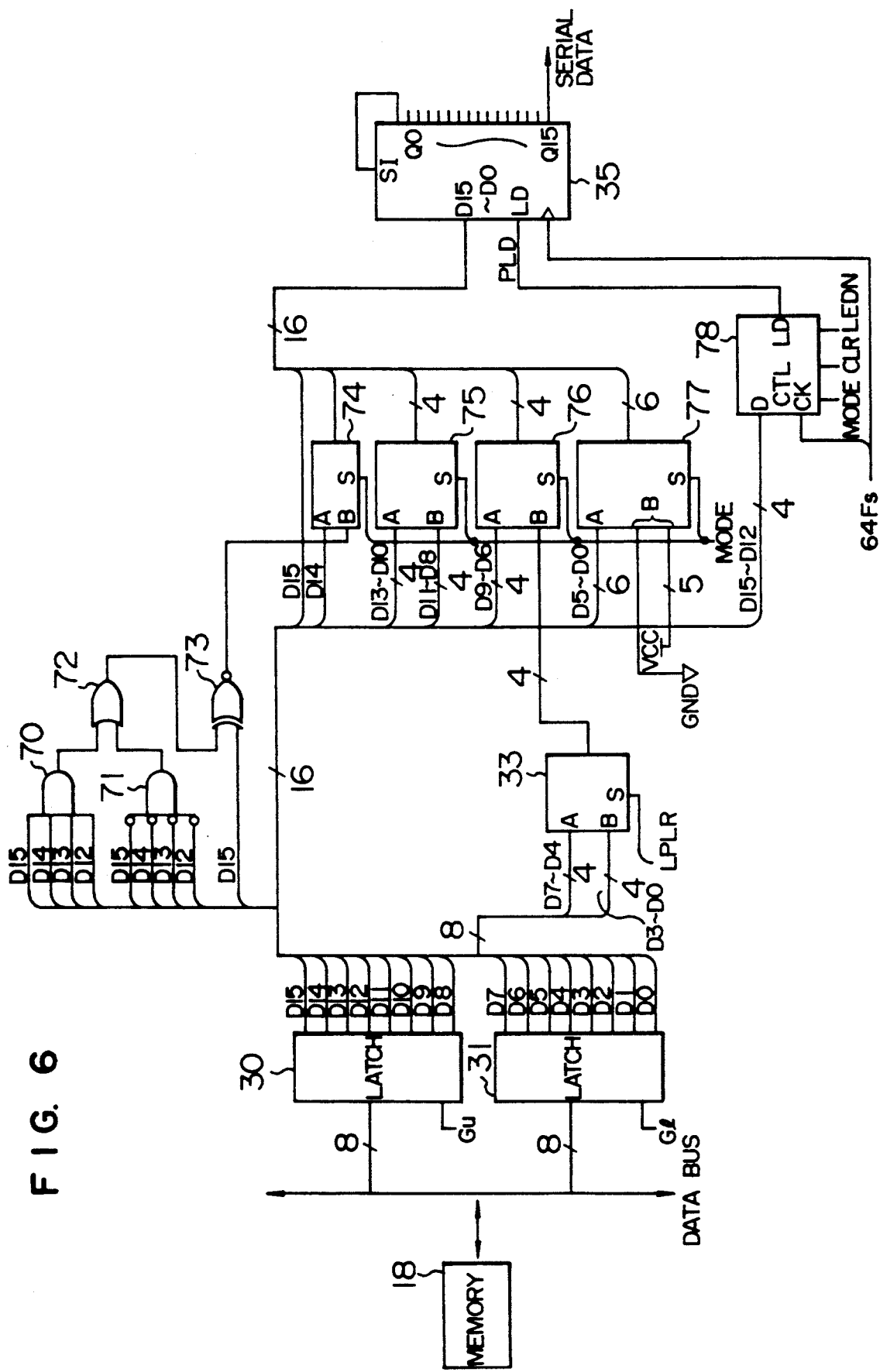
FIG. 6 shows a block diagram of an embodiment of the data expansion arrangement according to the present invention.

Hereinbelow will be described the embodiment of the data expansion arrangement in the digital audio tape recorder apparatus of the present invention. Referring to FIG. 6, the embodiment comprises latches 30 and 31, selectors 74-77, a shift register 35 and a load signal generator (CTL) 78 for the shift register 35.

As described above, the reproducing data is loaded from memory 18 to latches 30 and 31 in accordance with control signals Gu and Gl. When the system is operated in normal mode, latch 30 retains the upper 8 bits of the L and R channel 16-bit PCM data (Liu, Riu), as shown in FIG. 3, and latch 31 retains the lower 8 bits of L and R channel 16-bit PCM data (Lil, Ril) also shown in FIG. 3. Since control signal MODE is "Low" during normal mode operations, selectors 74-77 select input A, and hence the output of latches 30 and 31 are loaded to shift register 35 in accordance with load signal PLD which is generated by load signal generator (CTL) 78. The loaded data is transformed into LSB-first serial data by shift clock 64Fs, as described above in the data compression arrangement of the herein described embodiment of the digital audio tape recorder apparatus of the present invention.

Figure 7:
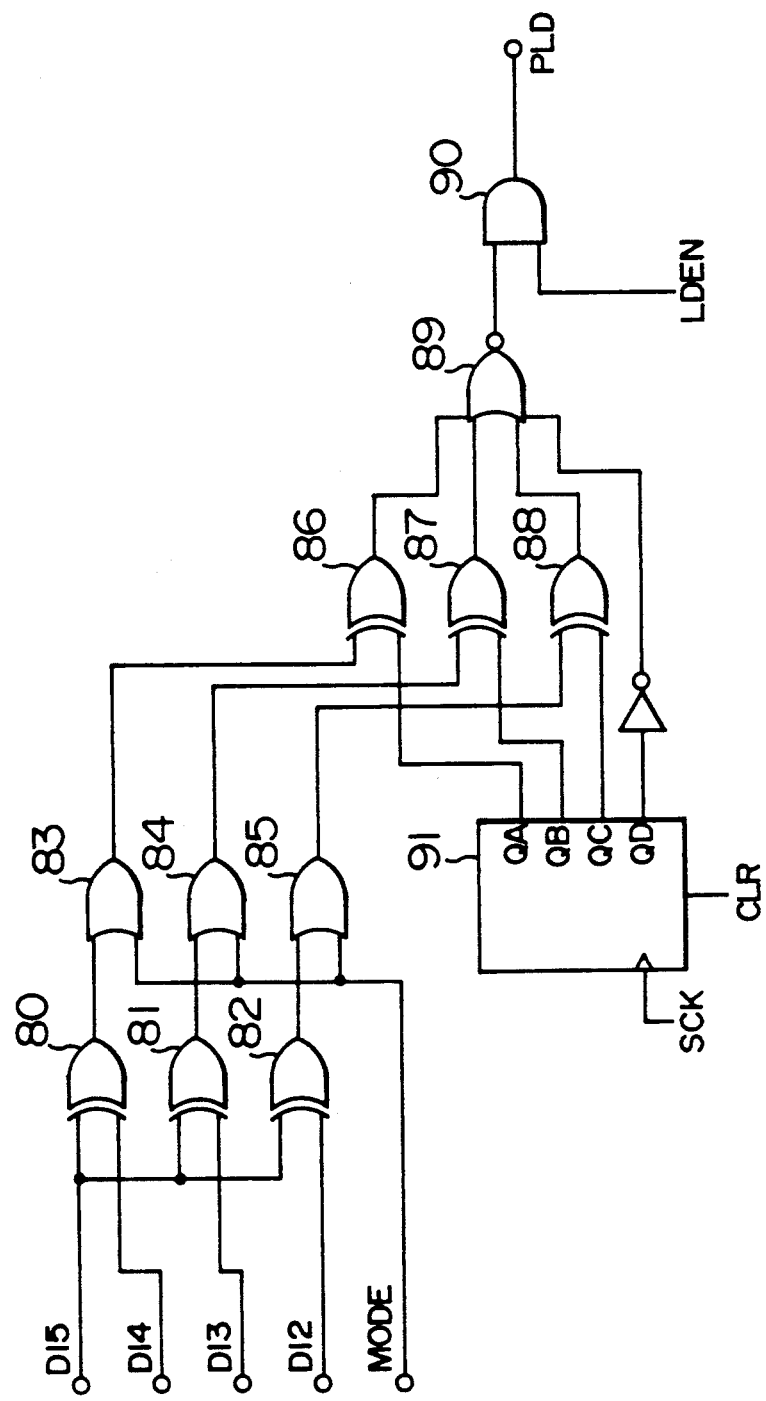
FIG. 7 shows a more detailed block diagram of a part of the embodiment of FIG. 6.

Referring to FIG. 7, this figure shows a more detailed block diagram of load signal generator (CTL) 78 of FIG. 6. The outputs D15-D12 of shift register 30 in FIG. 6 are input to EXCLUSIVE-OR gates 80-82 in order to derive a shift number of the MSB extension. Since the data expansion is operative only when the system is operating in LP reproducing mode, the outputs of EXCLUSIVE-OR gates 80-82 are enabled only when control signal MODE is "Low" by OR gates 83-85. Otherwise, when the system is in recording operation or in normal mode reproducing operation, control signal MODE is "Hi" and the shift number is set to seven which means there is no extra shifting prior to shifting out the serial data to be processed. Binary counter 91 is cleared by clear signal CLR and counts up by clock 64Fs. EXCLUSIVE-OR gates 86-88 compare the outputs of OR gates 83-85 and the outputs QC-QA of binary counter 91, and NOR gate 89 outputs a positive pulse when the output of EXCLUSIVE-OR gates 86-88 are all "Low" and output QD of binary counter 91 is "Hi". The load signal PLD for shift register 35 is output when a positive pulse is output from NOR gate 89 and is enabled by load enable signal LDEN at AND gate 90.

When the system is operating in LP reproducing mode, latch 30 retains the upper 8 bits of the L and R channel 12-bit compressed data (Liu, Riu), shown in FIG. 2, and latch 31 retains the combined data of the lower 4 bits of the L and R channel 12-bit compressed data (LRil), shown in FIG. 2. Since the control signal MODE is "High" in LP mode reproducing operation, selectors 74-77 select input B. Selector 33 selects the upper 4 bits and lower 4 bits of data retained at latch 31, in turn, in accordance with control signal LPLR, so that the lower 4 bits of the L and R channel 12-bit compressed data are input, in turn, to selector 76. Referring now to FIG. 1, the 16-bit data expanded from 12-bit compressed data consists of a number of successive bits, in the upper part, which are identical to the MSB in accordance with the upper 4 bits of the 12-bit compressed data. The next bit has an inverted value with respect to the MSB, and the succeeding 8 bits are identical to the remaining lower 8 bits of the 12-bit compressed data, except in the case when the upper 4 bits of the 12-bit compressed data are either "0000" or "1111". When the upper 4 bits of 12-bit compressed data are either "0000" or "1111", the inverted bit is omitted. AND gate 70 and INVERTED-AND gate 71 detect these cases, and EXCLUSIVE-NOR gate 73 generates the inverted value bit. When the number of successive bits identical to the MSB is less than 6 bits, additional data should be assigned to the remaining bits (which correspond to symbols "*" in FIG. 1). The data expansion arrangement embodiment of the present invention digital audio tape recorder apparatus shown in FIG. 6 assigns "0111 . . . " for such data at selector 77. The outputs of selectors 74–77 are loaded to shift register 35 in accordance with load control signal PLD which is generated at load signal generator (CTL) 78. The loaded data is transformed into LSB-first serial data by shift clock 64Fs.

Figure 8:
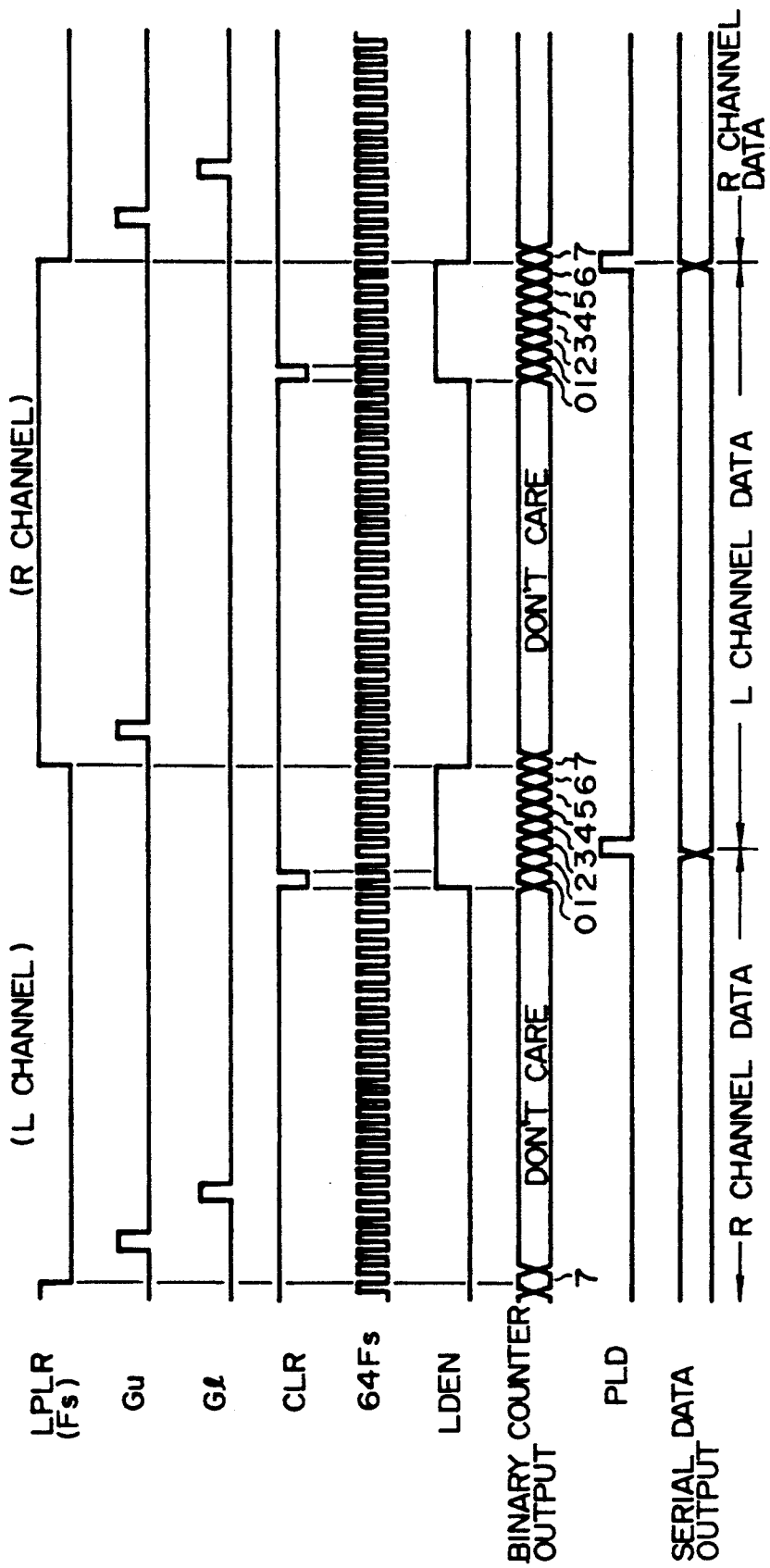
FIG. 8 shows in a brief timing chart the operation of the data expansion arrangement according to the embodiment of the present invention in FIG. 6.

Referring now to FIG. 8, this figure shows a brief timing chart of the data expansion arrangement shown in FIG. 6. As shown in FIG. 8, data loaded from memory 18 is retained at latches 30, 31 by control signals Gu, Gl. The outputs of latches 30, 31 are loaded to shift register 35 by load signal PLD, which is generated in accordance with the upper 4 bits of the 12-bit compressed data at outputs D15-D12 of latch 30 by comparing them with a binary counter at load signal generator (CTL) 78, shown in FIG. 7.

As compared with FIG. 4, the shift register 35 of FIG. 6 can be commonly used as shift register 21 in FIG. 4, since the output serial data of shift registers 21, 35 are both in LSB-first form.

Figure 9:
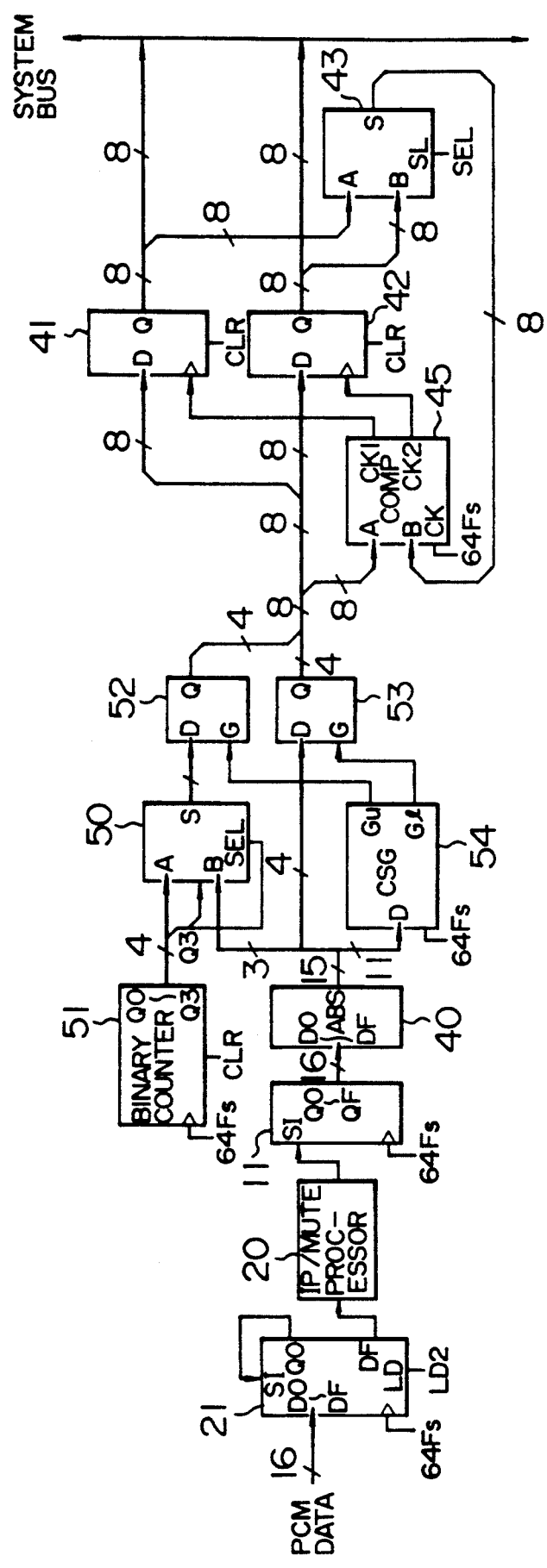
FIG. 9 shows a block diagram of an embodiment of the level encoder arrangement according to the present invention.

Hereinbelow will be described an embodiment of the level encoder arrangement of the digital audio tape recorder apparatus of the present invention. Referring to FIG. 9, the embodiment comprises a shift register 21 for transforming incoming parallel data into LSB-first serial data with the MSB being extended, a shift register 11 for transforming incoming serial data into parallel data, a binary counter for counting the shift number of data shifted through shift register 11, latches 107 and 108, flip-flops 110 and 111, selectors 107, 108 and 112, and a data comparator means 109.

As described above, the incoming parallel data is loaded to shift register 21 by load signal LD2 and is transformed into serial data with the MSB being extended by shift clock 64Fs. After the serial data is processed at the interpolation (IP) and mute processor means 20, it is input to shift register 11 to transform it into parallel data. The output of shift register 11 is converted to an absolute value at absolute data generator means (ABS) 40. Since the MSB of the original 16-bit data is retained, the absolute value is easily derived by executing exclusive-or operations between the input D0 and the remainder inputs D1-DF. Among the output of absolute data generator means (ABS) 40, the upper 11 bits are input to control signal generator means (CSG) 54, and the remaining lower 4 bits are input to input A of selector 50. The control signal generator 54 detects the timing when the number of input bits that are identical to the MSB is a certain bit length, and outputs the control signals Gu, Gl which control latches 52, 53 respectively, so as to update the retained data. The binary counter means 51 is initialized by clear signal CLR at the time when the 15-bit absolute value data of the incoming PCM data is output from absolute data generator means (ABS) 40, and counts the shift number by clock 64Fs which is the same as the shift clock of shift register 11. The outputs Q3–Q0 of binary counter 51 are input to input B of selector 50. Also, output Q3 of binary counter 51 is input to select control input SEL of selector 50. Therefore, input A is selected at selector 50 when output Q3 of binary counter 51 is "Low", and input B is selected when output Q3 is "Hi". The selected data is retained at latch 52 by control signal Gu. Hence, an 8-bit compressed level data set of PCM data shown in FIG. 10 can be derived at latches 52, 53. The outputs of latches 52, 53 are input to control signal generator means (COMP) 45 and flip-flops 41, 42. Flip-flop 41 retains the level data of the L-channel in accordance with the control signal CK1, generated at control signal generator means 45. Flip-flop 42 retains the level data of the R-channel in accordance with the control signal CK2, also generated at control signal generator means 45. The level data retained at flip-flops 41, 42 are selected, in turn, by selector means 43 in accordance with select signal SEL, which corresponds to the level data of the same channel outputs at latches 52, 53. The selected data and the outputs of latches 52, 53, which retain the latest level data of the corresponding channel, are input to control signal generator means (COMP) 45. The control signal generator means (COMP) 45 generates control signals CK1, CK2 by comparing the input level data. If the latest level data retained at latches 52, 53 is data of L-channel and is bigger than what was retained at flip-flop 41, then control signal CK1 is activated, and thus the data retained at flip-flop 41 is updated. If the latest level data retained at latches 52, 53 is data of R-channel and is bigger than what was retained at flip-flop 42, then control signal CK2 is activated, and thus the data retained at flip-flop 42 is updated. The peak data retained at each flip-flop is output to the system bus in accordance with the request made by the system controller means. After the level data is transferred to the system controller means, flip-flops 41, 42 are cleared by clear signal CLR in order to prepare for the next peak data. Hence, 8-bit peak level data of L channel and R channel are retained and updated.

As compared with FIG. 11, which shows an example of 8-bit compressed level data which can be derived by applying the data compression method in LP mode, the resolution of level data encoded by the embodiment of the present invention level encoder arrangement, which is shown in FIG. 10, is uniform at level ranges lower than −12.04 dB at 6.02/16=0.38 dB, and becomes more precise as the level range approaches zero dB, while the resolution of the prior art compressed level data is uniform in every range at 0.38 dB which is not sufficient for recording and reproducing audio data at levels near zero dB. Moreover, in the embodiment of the present invention level encoder arrangement shown in FIG. 9, shift register 21, which is used for transforming the incoming parallel data into serial data and for generating MSB-extended serial data in preparation for level encoding, can also be used for the data compression arrangement of the present invention. Therefore, the amount of required circuits can be reduced, and hence the unit cost of the total LSI signal processor, including data expansion/compression and level encoder, can be reduced.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

What is claimed is:

1. A digital audio tape recorder apparatus comprising:
   a first shift register means and feedback means for receiving incoming parallel data, transforming said parallel data into serial data and outputting said serial data in a least significant bit (LSB)-first order while retaining a most significant bit (MSB) of said parallel data at said first shift register by feeding said MSB back to an input of said first shift register;
   a first load signal generator means for generating load signals for said first shift register means in response to said incoming parallel data and mode signals which identify whether the apparatus is operating in a recording mode or in a reproducing mode and whether the apparatus is operating in a normal mode or in a long-play (LP) mode;
   a second shift register means for receiving serial data having an MSB extension, transforming said serial data with the MSB extension into second parallel data and providing an output comprising said second parallel data;
   a signal generator means for generating signals in accordance with the output of said second shift register means and said mode signals; and
   means, responsive to said signals generated by said signal generator means, for retaining a portion of the output of said second shift register means.

2. The apparatus according to claim 1, wherein a shift clock of said first shift register means is set to a clock rate more than 1.5 times faster than the rate to shift out all of said incoming parallel data to a serial output of said first shift register means in each loading cycle.

3. The apparatus according to claim 1, wherein said first load signal generator means comprises a counter for deriving from said incoming parallel data a load signal by comparing an output of said counter with a portion of said incoming parallel data.

4. The apparatus according to claim 1, further comprising:
   an absolute value generator means for receiving the output of said second shift register means and deriving the absolute value of said output of said second shift register;
   a counter which counts shifts of said serial data supplied to said second shift register means;
   means for selectively retaining the output of said absolute value generator means and the output of said counter in accordance with the output of said counter to thus derive level data;
   means for retaining the output of said means which derives level data to thus derive peak level data; and
   data comparator means for deriving control signals for updating said peak level data by comparing the output of said means which maintains peak level data with a current output of said means which maintains said level data.

* * * * *